(12) United States Patent
Scardera et al.

(10) Patent No.: US 8,163,587 B2
(45) Date of Patent: *Apr. 24, 2012

(54) METHODS OF USING A SILICON NANOPARTICLE FLUID TO CONTROL IN SITU A SET OF DOPANT DIFFUSION PROFILES

(75) Inventors: Giuseppe Scardera, Sunnyvale, CA (US); Dmitry Poplavskyy, San Jose, CA (US); Michael Burrows, Cupertino, CA (US); Sunil Shah, Union City, CA (US)

(73) Assignee: Innovalight, Inc., Sunnyvale, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/506,811

(22) Filed: Jul. 21, 2009

(65) Prior Publication Data

US 2011/0003464 A1  Jan. 6, 2011

Related U.S. Application Data

(60) Provisional application No. 61/222,628, filed on Jul. 2, 2009.

(51) Int. Cl.
*H01L 21/22* (2006.01)
(52) U.S. Cl. ............ 438/57; 438/94; 438/514; 438/530; 136/261; 257/E21.135
(58) Field of Classification Search ............ 438/57, 438/94, 514, 530; 136/261
See application file for complete search history.

(56) References Cited

U.S. PATENT DOCUMENTS

| 4,068,018 | A | 1/1978 | Hashimoto et al. |
|---|---|---|---|
| 5,656,556 | A | 8/1997 | Yang |
| 6,130,380 | A | 10/2000 | Nakamura |
| 6,171,975 | B1 | 1/2001 | Hase et al. |
| 6,461,901 | B1 | 10/2002 | Noguchi |
| 7,135,350 | B1 | 11/2006 | Smith et al. |
| 7,192,873 | B1 | 3/2007 | Kim et al. |

(Continued)

OTHER PUBLICATIONS

Bultman et al., Ideal Single Diffusion Step Selective Emitters: A Comparison Between Theory and Practice, *European Photovoltaic Solar Energy Conference and Exhibition*, Munich (2001).

(Continued)

*Primary Examiner* — Alexander G Ghyka
(74) *Attorney, Agent, or Firm* — Foley & Lardner LLP

(57) ABSTRACT

A method of forming a multi-doped junction on a substrate is disclosed. The method includes providing the substrate doped with boron atoms, the substrate comprising a front substrate surface, and depositing an ink on the front substrate surface in an ink pattern, the ink comprising a set of nanoparticles and a set of solvents. The method further includes heating the substrate in a baking ambient to a first temperature of between about 200° C. and about 800° C. and for a first time period of between about 3 minutes and about 20 minutes in order to create a densified film ink pattern. The method also includes exposing the substrate to a dopant source in a diffusion furnace with a deposition ambient, the deposition ambient comprising $POCl_3$, a carrier $N_2$ gas, a main $N_2$ gas, and a reactive $O_2$ gas, wherein a ratio of the carrier $N_2$ gas to the reactive $O_2$ gas is between about 1:1 to about 1.5:1, at a second temperature of between about 700° C. and about 1000° C., and for a second time period of about 5 minutes to about 35 minutes. The method also includes heating the substrate in a drive-in ambient to a third temperature of between about 800° C. and about 1100° C.

27 Claims, 9 Drawing Sheets

U.S. PATENT DOCUMENTS

| | | | |
|---|---|---|---|
| 7,355,238 | B2 | 4/2008 | Takata et al. |
| 7,411,255 | B2 | 8/2008 | Parekh et al. |
| 7,615,393 | B1 * | 11/2009 | Shah et al. ............... 438/48 |
| 2003/0134469 | A1 | 7/2003 | Horzel et al. |
| 2005/0176164 | A1 | 8/2005 | Gee et al. |
| 2006/0096635 | A1 | 5/2006 | Tuttle |
| 2006/0211187 | A1 | 9/2006 | Choi et al. |
| 2007/0246689 | A1 | 10/2007 | Ge et al. |
| 2008/0111206 | A1 | 5/2008 | Hanoka et al. |
| 2008/0138966 | A1 | 6/2008 | Rogojina et al. |
| 2008/0146005 | A1 | 6/2008 | Lemmi et al. |
| 2008/0160265 | A1 | 7/2008 | Hieslmair et al. |
| 2008/0182390 | A1 | 7/2008 | Lemmi et al. |
| 2008/0302660 | A1 | 12/2008 | Kahn et al. |
| 2009/0017606 | A1 | 1/2009 | Fath et al. |
| 2009/0020158 | A1 | 1/2009 | Ohtsuka et al. |
| 2009/0239330 | A1 | 9/2009 | Vanheusden et al. |
| 2009/0239363 | A1 | 9/2009 | Leung et al. |
| 2009/0269913 | A1 | 10/2009 | Terry et al. |
| 2010/0015749 | A1 | 1/2010 | Borden |

OTHER PUBLICATIONS

Drabczyk et al., The influence of porous silicon on junction formation in silicon solar cells, *Solar Energy Materials & Solar Cells*, 76:545-551 (2003).

González-Diaz et al., Low-porosity silicon nanostructures on monocrystalline silicon solar cells, *Physica E*, 38:215-218 (2007).

Jones, Scotten W., Diffusion in Silicon, IC Knowledge LLC (2000).

Moon et al., Selective emitter using porous silicon for crystalline silicon solar cells, *Solar Energy Materials & Solar Cells*, (2008).

U.S. Appl. No. 12/656,710, filed Feb. 12, 2010, Scardera et al.

U.S. Appl. No. 12/626,198, filed Nov. 25, 2009, Kelman et al.

U.S. Appl. No. 12/692,878, filed Jan. 25, 2010, Scardera et al.

Bentzen et al., "Understanding phosphorus emitter diffusion in silicon solar cell processing," Proceedings of the $21^{st}$ European Photovoltaic Solar Energy Conference, Dresden, Germany, 2006, 1388-1391.

Voyer et al., "Progress in the Use of Sprayed Phosphoric Acid as an Inexpensive Dopant Source for Industrial Solar Cells," $20^{th}$ European Photovoltaic Solar Energy Conference, Jun. 2005, 4 pages.

U.S. Appl. No. 12/794,188, filed Jun. 4, 2010, Scardera et al.

International Search Report and Written Opinion mailed Sep. 2, 2010, in PCT/US2010/040623, 10 pages.

International Search Report and Written Opinion dated Jan. 27, 2011, in PCT/US2010/057782, 14 pages.

International Search Report and Written Opinion dated Mar. 18, 2011, in PCT/US2011/022107, 8 pages.

International Search Report and Written Opinion mailed May 27, 2011, in PCT/US2011/22377, 13 pages.

International Search Report and Written Opinion mailed Sep. 16, 2011, in PCT/US2011/038359, 14 pages.

U.S. Appl. No. 13/099,794, filed May 3, 2011, Kelman et al.

U.S. Appl. No. 13/172,040, filed Jun. 9, 2011, Abbott et al.

U.S. Appl. No. 13/238,252, filed Sep. 21, 2011, Scardera et al.

International Search Report and Written Opinion mailed Oct. 21, 2011, in PCT/US2011/042330, 9 pages.

Altermatt et al., "Rear surface passivation of high-efficiency silicon solar cells by a floating junction," J. Appl. Phys., Sep. 15, 1996, 80(6):357-3586.

Blakers et al., "22.8% efficient silicon solar cell," Appl. Phys. Lett., Sep. 25, 1989, 55(13):1363-1365.

Dauwe et al., "Experimental Evidence of Parasitic Shunting in Silicon Nitride Rear Surface Passivated Solar Cells," Progress in Photovoltaics: Research and Applications, 2002, 10:271-279.

Honsberg et al., "685 mV Open-circuit voltage laser grooved silicon solar cell," Solar Energy Materials and Solar Cells, 1994, 34:117-123.

Hubbard et al., "Thermodynamic stability of binary oxides in contact with silicon," J. Mater. Res., Nov. 1996, 11(11):2757-2776.

Trupke et al., "Photoluminescence imaging of silicon wafers," Applied Physics Letters, 2006, 89:044107-1 to 044107-3.

Wang et al., "24% efficient silicon solar cells," Appl. Phys. Lett., Aug. 6, 1990, 57(6):602-604.

\* cited by examiner

METHODS OF USING A SILICON NANOPARTICLE FLUID TO CONTROL IN SITU A SET OF DOPANT DIFFUSION PROFILES

CROSS-REFERENCE TO RELATED APPLICATIONS

This application claims the benefit of U.S. Pat. No. 61/222,628 filed Jul. 2, 2009, entitled Methods of Using A Silicon Nanoparticle Fluid To Control In Situ A Set Of Dopant Diffusion Profiles, the entire disclosure of which is incorporated by reference.

FIELD OF DISCLOSURE

This disclosure relates in general to p-n junctions and in particular to methods of using a silicon nanoparticle fluid to control in situ a set of dopant diffusion profiles.

BACKGROUND

A solar cell converts solar energy directly to DC electric energy. Generally configured as a photodiode, a solar cell permits light to penetrate into the vicinity of metal contacts such that a generated charge carrier (electrons or holes (a lack of electrons)) may be extracted as current. And like most other diodes, photodiodes are formed by combining p-type and n-type semiconductors to form a junction.

Electrons on the p-type side of the junction within the electric field (or built-in potential) may then be attracted to the n-type region (usually doped with phosphorous) and repelled from the p-type region (usually doped with boron), whereas holes within the electric field on the n-type side of the junction may then be attracted to the p-type region and repelled from the n-type region. Generally, the n-type region and/or the p-type region can each respectively be comprised of varying levels of relative dopant concentration, often shown as n−, n+, n++, p−, p+, p++, etc. The built-in potential and thus magnitude of electric field generally depend on the level of doping between two adjacent layers.

Substantially affecting solar cell performance, carrier lifetime (recombination lifetime) is defined as the average time it takes an excess minority carrier (non-dominant current carrier in a semiconductor region) to recombine and thus become unavailable to conduct an electrical current. Likewise, diffusion length is the average distance that a charge carrier travels before it recombines. In general, although increasing dopant concentration improves conductivity, it also tends to increase recombination. Consequently, the shorter the recombination lifetime or recombination length, the closer the metal region must be to where the charge carrier was generated.

Most solar cells are generally formed on a silicon substrate doped with a first dopant (commonly boron) forming an absorber region, upon which a second counter dopant (commonly phosphorous) is diffused forming the emitter region, in order to complete the p-n junction. After the addition of passivation and antireflection coatings, metal contacts (fingers and busbar on the emitter and pads on the back of the absorber) may be added in order to extract generated charge. Emitter dopant concentration, in particular, must be optimized for both carrier collection and for contact with the metal electrodes.

In general, a low concentration of (substitutional) dopant atoms within an emitter region will result in both low recombination (thus higher solar cell efficiencies), and poor electrical contact to metal electrodes. Conversely, a high concentration of (substitutional) dopant atoms will result in both high recombination (thus reducing solar cell efficiency), and low resistance ohmic contacts to metal electrodes. Often, in order to reduce manufacturing costs, a single dopant diffusion is generally used to form an emitter, with a doping concentration selected as a compromise between low recombination and low resistance ohmic contact. Consequently, potential solar cell efficiency (the percentage of sunlight that is converted to electricity) is limited.

One solution is the use of a dual-doped or selective-emitter. A selective emitter uses a first lightly doped region optimized for low recombination, and a second heavily doped region (of the same dopant type) optimized for low resistance ohmic metal contact. However, a selective-emitter configuration may be difficult to achieve in a one-step diffusion process and may involve several masking steps, consequently increasing manufacturing costs. In addition, since there are generally no visual boundaries between high doped and low doped emitter regions, the alignment of a metal contact onto a previously deposited highly doped region may be difficult.

Like the emitter region, the deposition of a BSF (back surface field) may also be problematic. A BSF is generally a region located at the rear of a solar cell which tends to repel minority carriers in the absorber region from high recombination zones at the rear surface and metalized regions of the substrate. In general a BSF may be formed using dopants of the same type as those used in the absorber region. In this case the concentration of dopant atoms in the BSF is selected to be higher than that used to dope the absorber region, thus creating a potential barrier between the bulk of the substrate and the rear surface. A BSF is generally formed using aluminum (or other deposited materials) which is generally first screen printed onto the back of a solar cell and then co-fired in a belt furnace along with the front side metal contacts (commonly formed from screen printed silver paste). Typically, silicon atoms in the substrate tend to diffuse in the aluminum and subsequently re-crystallize, incorporating aluminum atoms into the silicon crystal.

However, although relatively easy to manufacture, the thermal expansion coefficient of aluminum (about 24 μm/m° C.) is much greater than silicon (about 3 μm/m° C.). Consequently, substrate bowing tends to occur. And while some reduction in carrier recombination is achieved with the screen printed Al BSF, there is still significant recombination occurring at the rear which tends to reduce solar cell efficiency.

In view of the foregoing, there is a desire to provide methods of using a silicon nanoparticle fluid to control in situ a dopant diffusion profile.

SUMMARY

The invention relates, in one embodiment, to a method of forming a multi-doped junction on a substrate. The method includes providing the substrate doped with boron atoms, the substrate comprising a front substrate surface, and depositing an ink on the front substrate surface in an ink pattern, the ink comprising a set of nanoparticles and a set of solvents. The method further includes heating the substrate in a baking ambient to a first temperature of between about 200° C. and about 800° C. and for a first time period of between about 3 minutes and about 20 minutes in order to create a densified film ink pattern. The method also includes exposing the substrate to a dopant source in a diffusion furnace with a deposition ambient, the deposition ambient comprising $POCl_3$, a carrier $N_2$ gas, a main $N_2$ gas, and a reactive $O_2$ gas, wherein a ratio of the carrier $N_2$ gas to the reactive $O_2$ gas is between about 1:1 to about 1.5:1, at a second temperature of between about 700° C. and about 1000° C., and for a second time period of about 5 minutes to about 35 minutes. The method also includes heating the substrate in a drive-in ambient to a third temperature of between about 800° C. and about 1100° C.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION

Figure 1:
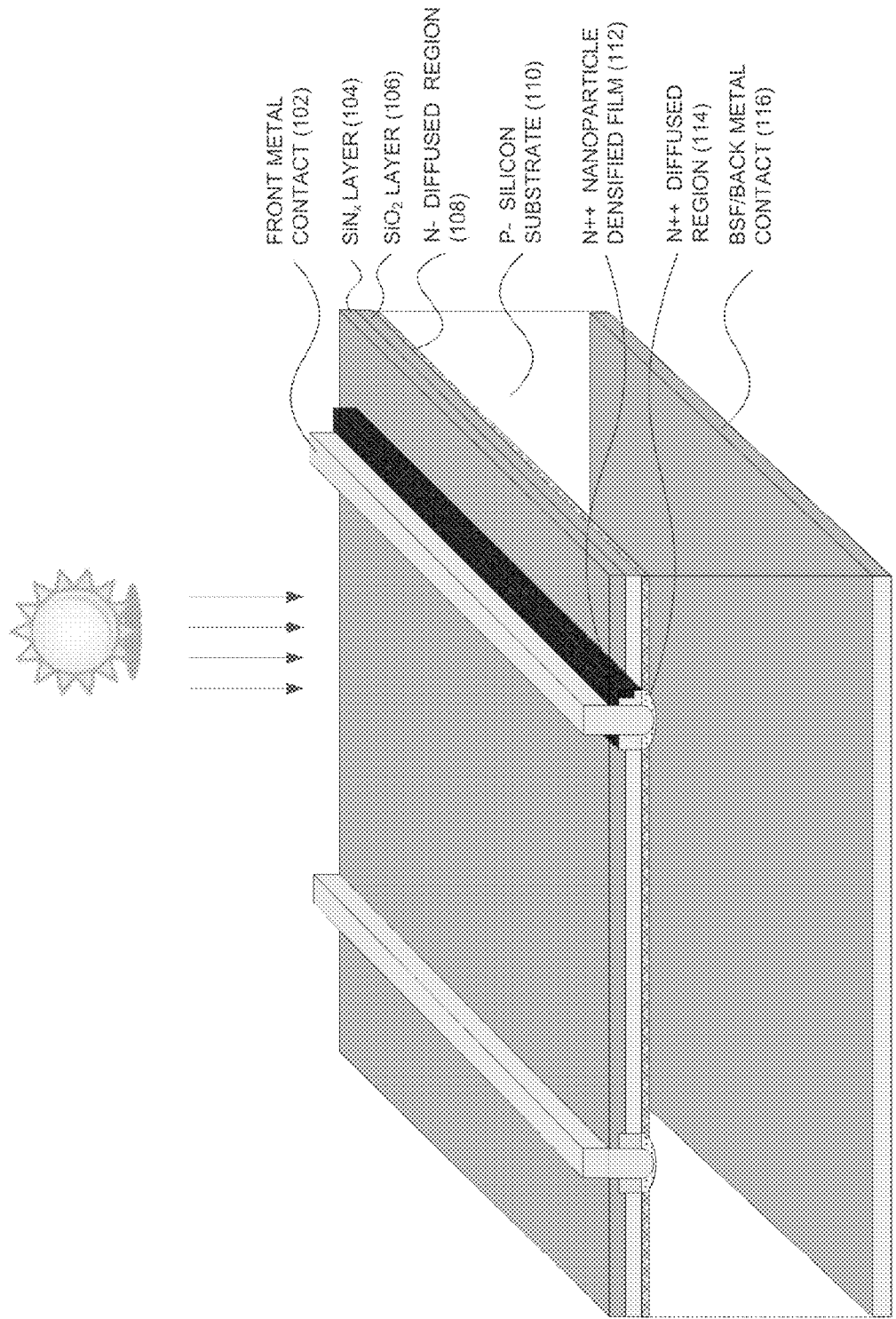
FIG. 1 shows a simplified diagram of a solar cell with a selective emitter and aluminum, in accordance with the invention.

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

As previously described, forming multi-doped junctions on a substrate, such as for a solar cell, tends to be problematic since multiple separate diffusions and patterning steps are often required, consequently increasing manufacturing costs.

In an advantageous manner, a silicon nanoparticle fluid (e.g., ink, paste, etc.) may be deposited in an (ink) pattern on a silicon substrate surface, such that both a set of lightly doped regions and a set of heavily doped regions are formed in situ. In the case of a selective emitter, a lightly doped region with sheet resistance of between about 90 Ohm/sq to about 120 Ohm/sq may be formed and a heavily doped region (of the same dopant type) with a sheet resistance may be formed between about 30 Ohm/sq to about 60 Ohm/sq.

While not wishing to be bound by theory, the inventors believe that the substantially larger surface areas of deposited nanoparticles (in comparison to the relative smaller surface area of the underlying substrate) allow a larger volume of surface PSG to be formed, which in turn, allows for a larger amount of phosphorus to be deposited.

Nanoparticles, having at least one dimension less than 100 nm, tend to have substantially large surface areas. For example, a silicon nanoparticle with a diameter of 10 nanometers may have a surface area of about 314 nm$^2$. Consequently, the larger surface area allows for greater reduction of phosphorus from $P_2O_5$ (via the reaction described in Equation 1A-B below), than on the silicon substrate surface. Phosphorus may then diffuse into the underlying silicon substrate via the silicon cluster channels formed in the silicon fluid layer via partial sintering of the silicon nanoparticles.

Consequently, by maintaining a drive-in temperature above 850° C., and further by altering the ratio of nitrogen to oxygen in the drive-in ambient, the region upon which the silicon nanoparticle fluid is deposited (fluid region) and the region without the deposited silicon nanoparticle fluid (exposed region) may be altered between a highly and lightly doped configuration.

In general, in order to form a multi-doped junction, such as a selective emitter, a combination of gases and a masking step are often used to deposit dopants on a Group IV substrate. That is, a mask is first deposited on the Group IV (e.g., silicon, etc.) substrate in which areas that are to be highly doped are exposed after which the Group IV substrate is exposed to a first dopant gas. The mask is then removed, and the Group IV substrate is then exposed to a second lower concentration dopant gas, thus creating a selective emitter configuration.

For example, in order to diffuse phosphorous into a boron doped silicon substrate, $POCl_3$ (phosphorus oxychloride) is used. The reaction is typically:

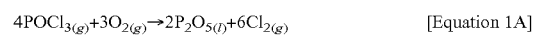  [Equation 1A]

  [Equation 1B]

  [Equation 2]

The typical gases involved in a $POCl_3$ diffusion process include: an ambient nitrogen gas (main $N_2$ gas), a carrier nitrogen gas (carrier $N_2$ gas) flowed through a bubbler filled with liquid $POCl_3$, a reactive oxygen gas (reactive $O_2$ gas) configured to react with the vaporized $POCl_3$ to form the deposition (processing) gas, and optionally a main oxygen gas (main $O_2$ gas) configured to later form an oxide layer.

In general, a silicon substrate is first placed in a heated tube furnace with the main $N_2$ gas. $POCl_3$ vapor is then flowed into the tube furnace, heated to a deposition temperature, and exposed to reactive $O_2$ gas to form $P_2O_5$ (Phosphorus Oxide) on the silicon substrate, as well as $Cl_2$ (chlorine) gas that interacts with and removes metal impurities in the silicon substrate. $P_2O_5$ in turn reacts with the silicon substrate to form $SiO_2$, and free P atoms. The simultaneous oxidation of the silicon wafer during the deposition results in the formation of a $SiO_2.P_2O_5$ layer (PSG or phosphorous silicate glass).

An additional drive-in step (free of any $POCl_3$ flow) is typically employed using the deposition temperature or a higher temperature in order to enable the free phosphorous atoms to diffuse further into the silicon substrate and substitutionally replace silicon atoms in the lattice in order to be available for charge carrier generation. During this step, a set of drive-in ambient gases which may comprise of main $N_2$ gas and/or main $O_2$ gas is flowed into the tube furnace. The use of oxygen would result in the formation of an oxide layer at the silicon wafer surface. Such an oxide layer attenuates the diffusion of P atoms from the PSG layer into the silicon substrate allowing for more control over the resultant diffusion profiles. In general, for a given temperature phosphorous diffuses slower in $SiO_2$ than in silicon.

Likewise, boron may be deposited on a phosphorus doped silicon substrate using BBr$_3$ (Boron Tribromide). The reaction is typically:

$$4BBr_{3(g)} + 3O_{2(g)} \rightarrow 2B_2O_{3(g)} + 6Br_{2(g)} \quad \text{[Equation 3A]}$$

$$2B_2O_{3(g)} + 3Si_{(s)} \rightarrow 4B_{(s)} + 3SiO_{2(s)} \quad \text{[Equation 3B]}$$

$$Si + O_2 \rightarrow SiO_2 \quad \text{[Equation 2]}$$

The typical gases involved in a BBr$_3$ diffusion process include: an ambient nitrogen gas (main N$_2$ gas), a carrier nitrogen gas (carrier N$_2$ gas) flowed through a bubbler filled with liquid BBr$_3$, a reactive oxygen gas (reactive O$_2$ gas) configured to react with the vaporized BBr$_3$ to form the deposition (processing) gas, and optionally a main oxygen gas (main O$_2$ gas) configured to later form an oxide layer. In general, a silicon substrate is first placed in a heated tube furnace with the main N$_2$ gas. BBr$_3$ vapor is then flowed into the tube furnace, heated to a deposition temperature, and exposed to reactive O$_2$ (oxygen) gas to form B$_2$O$_3$ (Boric Oxide) on the silicon substrate.

B$_2$O$_3$ in turn reacts with the silicon substrate to form SiO$_2$, and free B atoms. The simultaneous oxidation of the silicon wafer during the deposition results in the formation of a SiO$_2$.B$_2$O$_3$ layer (BSG or boro-silicate glass)

An additional drive-in step (free of any BBr$_3$ flow) is typically employed using the deposition temperature or a higher temperature in order to enable the free Boron atoms to diffuse further into the silicon substrate and substitutionally replace silicon atoms in the lattice in order to be available for charge carrier generation. During this step, a set of drive-in ambient gases which may comprise of nitrogen (main N$_2$) and/or oxygen (main O$_2$) is flowed into the tube furnace. The use of oxygen would result in the formation of an oxide layer at the silicon wafer surface. Such an oxide layer attenuates the diffusion of B atoms from the B$_2$O$_3$ layer into the silicon substrate allowing for more control over the resultant diffusion profiles. In general, for a given temperature boron diffuses slower in SiO$_2$ than in silicon. In some cases a pre-deposition oxide layer may be grown onto the silicon wafer to allow for better diffusion uniformity.

As with PSG described above, the inventors also believe that the substantially larger surface areas of deposited nanoparticles (in comparison to the relative smaller surface area of the underlying substrate) should allow a larger volume of surface BSG to be formed, which in turn, allows a larger amount of boron to be deposited (via the reaction described in Equation 3A-B below).

Another approach to phosphorus doping of silicon wafers is a spray-on technique whereby a phosphoric acid (H$_3$PO$_4$) mixture (usually mixed with water or an alcohol like ethanol or methanol) is sprayed onto the wafer and then subjected to a thermal treatment.

The diffusion of phosphorus into a silicon wafer using phosphoric acid as a dopant source occurs via the following reaction:

$$2H_3PO_4 \rightarrow P_2O_5 + 3H_2O \quad \text{[Equation 4A]}$$

$$2P_2O_5 + 5Si \rightarrow 5SiO_2 + 4P \quad \text{[Equation 4B]}$$

The first step involves the dehydration of phosphoric acid which produces phosphoric oxide (P$_2$O$_5$) on the silicon surface which in turn acts as the phosphorus source. P$_2$O$_5$ in turn reacts with the silicon substrate to form SiO$_2$, and free P atoms.

One method of depositing the layer of nanoparticles onto the silicon substrate surface is the deposition through the use of a fluid, such as a colloidal dispersion. Generally, colloidal dispersions of Group IV nanoparticles are possible because the interaction of the particle surface with the solvent is strong enough to overcome differences in density, which usually result in a material either sinking or floating in a liquid. That is, smaller nanoparticles disperse more easily than larger nanoparticles. Commonly, particle loadings for an ink may be around about 3% wt. In contrast, if the particle loading substantially increases above about 10% wt., the colloidal dispersion thickens into a paste.

In general, the Group IV nanoparticles are transferred into the colloidal dispersion or paste under a vacuum, or an inert substantially oxygen-free environment. In addition, the use of particle dispersal methods and equipment such as sonication, high shear mixers, and high pressure/high shear homogenizers may be used to facilitate dispersion of the nanoparticles in a selected solvent or mixture of solvents.

Examples of solvents include alcohols, aldehydes, ketones, carboxylic acids, esters, amines, organosiloxanes, halogenated hydrocarbons, and other hydrocarbon solvents. In addition, the solvents may be mixed in order to optimize physical characteristics such as viscosity, density, polarity, etc.

In addition, in order to better disperse the Group IV nanoparticles in the colloidal dispersion, nanoparticle capping groups may be formed with the addition of organic compounds, such as alcohols, aldehydes, ketones, carboxylic acids, esters, and amines, as well as organosiloxanes. Alternatively, capping groups may be added in-situ by the addition of gases into the plasma chamber. These capping groups may be subsequently removed during the sintering process, or in a lower temperature pre-heat just before the sintering process.

For example, bulky capping agents suitable for use in the preparation of capped Group IV semiconductor nanoparticles include C4-C8 branched alcohols, cyclic alcohols, aldehydes, and ketones, such as tertiary-butanol, isobutanol, cyclohexanol, methyl-cyclohexanol, butanal, isobutanal, cyclohexanone, and oraganosiloxanes, such as methoxy(tris(trimethylsilyl)silane)(MTTMSS), tris(trimethylsilyl)silane (TTMSS), decamethyltetrasiloxane (DMTS), and trimethyl-methoxysilane (TMOS).

Once formulated, the colloidal dispersion may be applied to a substrate and subjected to a heat treatment in order to sinter the Group IV nanoparticles into a densified conductive film. Examples of application methods include, but are not limited to, roll coating, slot die coating, gravure printing, flexographic drum printing, and inkjet printing methods, etc.

Additionally, various configurations of doped Group IV nanoparticle colloidal dispersions can be formulated by the selective blending of doped, undoped, and/or differently doped Group IV nanoparticles. For example, various formulations of blended Group IV nanoparticle colloidal dispersions can be prepared in which the dopant level for a specific layer of a junction is formulated by blending doped and undoped Group IV nanoparticles to achieve the requirements for that layer. Alternatively, the blended Group IV nanoparticle colloidal dispersions may be used to compensate for substrate defects, such as the passivation of oxygen atoms in order to reduce undesirable energy states.

Referring now to FIG. 1, a simplified diagram of a solar cell with a selective emitter and aluminum BSF. In a common configuration, an n++ diffused region 114 and n-diffused region 108 are first formed on a p– (lightly doped) silicon substrate 110. SiO$_2$ layer 106 is then formed on a p– (lightly doped) silicon substrate 110 in order to help passivate the front surface of silicon substrate 110.

A SiN$_x$ 104 layer is then formed on the front surface of SiO$_2$ layer 106. Like SiO$_2$ layer 106, SiN$_x$ layer 104 helps passivate the surface of silicon substrate 110, minimizing both contamination of the wafer bulk from external sources, as well as reducing minority carrier recombination at the surface of silicon substrate 110. Additionally, $SiN_x$ 104 layer may be optimized to reduce the reflectivity of the front surface of the solar cell, substantially improving efficiency and thus performance.

Front-metal contact 102 and back surface field (BSF)/back metal contact 116 are then generally formed on silicon substrate 110. Front-metal contact 102 is generally formed from an Ag paste comprising Ag powder (70 to 80 wt %), lead borosilicate glass $PbO$—$B_2O_3$—$SiO_2$ (1 to 10 wt %), and organic components (15 to 30 wt %). BSF/back metal contact 116 is generally formed from aluminum, and is configured to create an electrical field that repels and thus minimize the impact of minority carrier rear surface recombination. In addition, Ag pads [not shown] are generally applied onto BSF/back metal contract 116 in order to facilitate soldering for interconnection into modules.

Experiment 1

Figure 2:
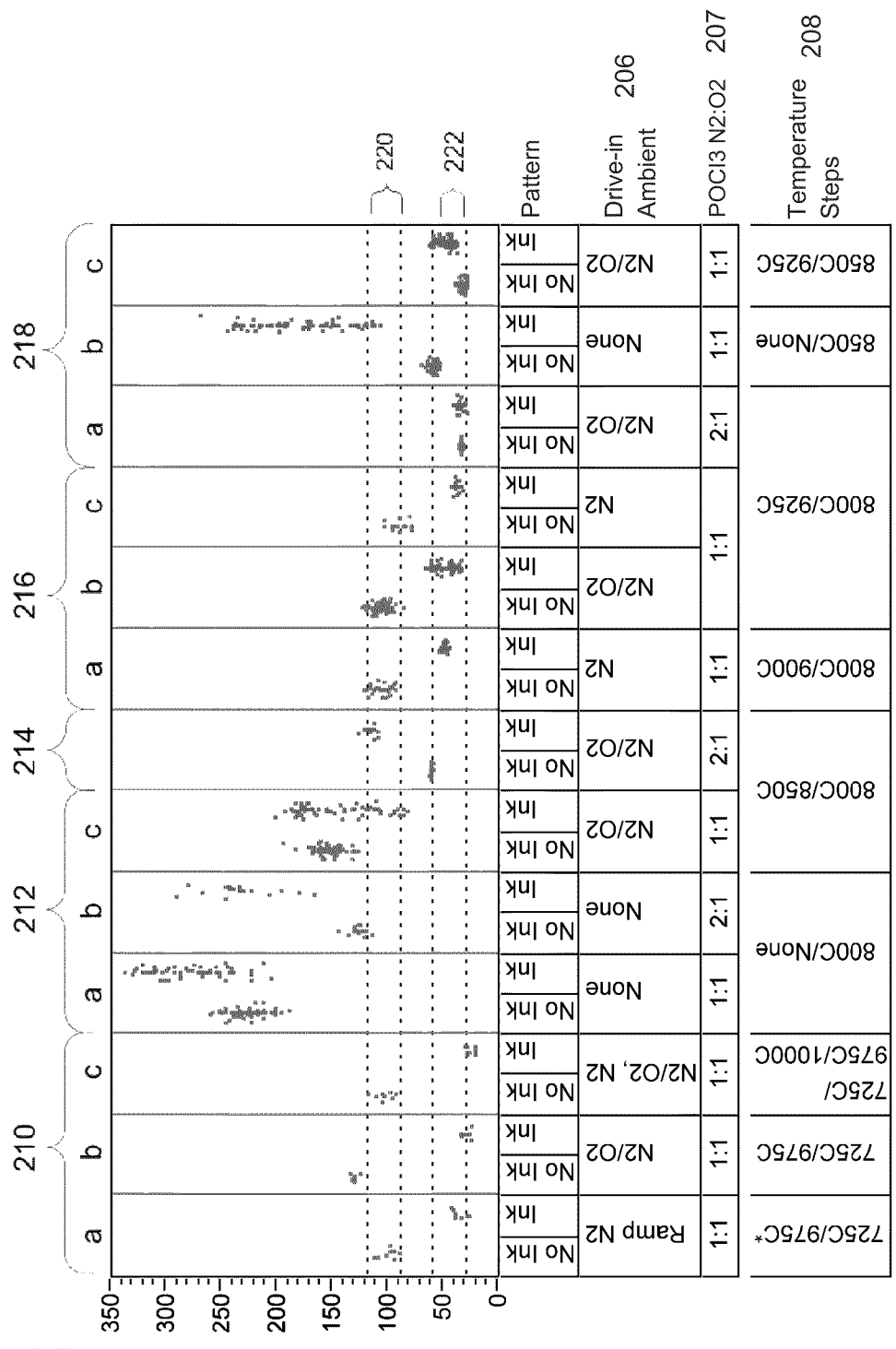
FIG. 2 shows a simplified diagram of eight sets of crystalline silicon substrates in a first experiment configured with various ink configurations, in accordance with the invention.

Referring now to FIG. 2 shows a simplified diagram of eight sets of crystalline silicon substrates configured with various silicon nanoparticle fluid configurations, in accordance with the invention. All substrate sets comprised of saw-damage etched p-type silicon substrates, each with a thickness of about 180 um and a resistivity of about 2 Ohm-cm. The substrates were first cleaned with piranha (a mixture of sulfuric acid ($H_2SO_4$) and hydrogen peroxide ($H_2O_2$)). This cleaning was followed by a DI water rinsing step and then a subsequent buffered oxide etch (BOE) dip followed by a final DI water rinse. Substrates were then dried using $N_2$ prior to a silicon nanoparticle fluid (containing silicon nanoparticles with about 1.4 wt % phosphorous) deposited on one side of the substrates and comprising about 4 wt % silicon nanoparticles in a set of organic solvents.

After baking at a temperature of 600° C. in a baking ambient in a rapid thermal processing (RTP) tool for a time period of about 3 minutes in order to densify the film and evaporate solvent molecules in order to form a densified film. Although the baking ambient was inert in this experiment, an oxidizing ambient may be used.

In general, all the substrates in set 210 were exposed to a dopant source in a diffusion furnace with a deposition ambient of $POCl_3$, $N_2$, and $O_2$, at temperatures ranging from about 725° C. to about 850° C., and for time periods ranging from about 20 minutes to about 35 minutes, followed by additional drive-in thermal steps in a drive-in ambient ranging up to about 1000° C. for time periods up to about 30 minutes. The entire processes involved time periods ranging from about 50 minutes to about 240 minutes. The residual PSG glass layers on the substrate surface and the densified film surface were subsequently removed by a BOE cleaning step for about 5 minutes.

In substrate subset 210c, the drive-in temperature was increased to about 1000° C. for about 30 minutes. Substrate subset 210a had a drive-in ambient of just nitrogen with a ramp to about 975° C. without any hold time resulting in an average fluid region sheet resistance of about 34.7 ohm/sq and average exposed region sheet resistance of about 99.6 ohm/sq.

Substrate subset 210b had a drive-in ambient of main $N_2$ and main $O_2$ in a ratio of about 1:1 for about 15 minutes resulting in an average fluid region sheet resistance of about 30.0 ohm/sq and an average exposed region sheet resistance of about 130.6 ohm/sq. And substrate subset 210c had a first drive-in ambient of main $N_2$ and main $O_2$ in a ratio about 1:1 for about 15 minutes, and a second drive-in ambient of just nitrogen for about 30 minutes, and an average fluid region sheet resistance of about 25.7 ohm/sq and an average exposed region sheet resistance of about 103.8 ohm/sq. And although substrate subset 210b showed an average exposed region sheet resistance that is slightly higher than the preferable range for a lightly doped region (about 90 Ohm/sq to about 120 Ohm/sq), it still may be used to form a selective emitter.

All the substrates in subset 216 had an initial deposition temperature of about 800° C. for about 20 minutes, a carrier $N_2$ to reactive $O_2$ ratio during deposition of about 1:1, and a drive-in temperature of at least about 900° C. Substrate subset 216a had a drive-in ambient of just main $N_2$ for about 15 minutes resulting in an average fluid region sheet resistance of about 48.8 ohm/sq and an average exposed region sheet resistance of about 105.6 ohm/sq.

Substrate subset 216b had a drive-in ambient of main $N_2$ and main $O_2$ in a ratio of about 1:1 for about 15 minutes at about 925° C. resulting in an average fluid region sheet resistance of about 49.3 ohm/sq and an average exposed region sheet resistance of about 106.4 ohm/sq. Substrate subset 216c had a drive-in ambient of just main $N_2$ for about 15 minutes resulting in an average fluid region sheet resistance of about 48.7 ohm/sq and an average exposed region sheet resistance of about 105.6 ohm/sq.

Substrate set 214 had an initial deposition temperature of about 800° C. for about 20 minutes, a carrier $N_2$ to reactive $O_2$ ratio during deposition of 2:1, and a drive-in temperature of about 850° C. for about 15 minutes in main $N_2$ and main $O_2$. The configuration of substrate subset 214 may also be used to form a selective emitter, although with an inverse profile. That is, the fluid regions are lightly doped and the exposed regions are heavily doped. While not wishing to be bound by theory, the inventors believe that this effect may be achieved by both reducing the drive-in temperature to about 850° C. and by increasing the ratio of carrier $N_2$ to reactive $O_2$ during deposition to about 2:1. Consequently, the average fluid region sheet resistance was about 115.6 ohm/sq and an average exposed region sheet resistance was about 60.4 ohm/sq.

In contrast, substrate subsets 212a-c, and 218b had average sheet resistances that are generally too high for an optimal selective emitter configuration. As previously described, a high sheet resistance generally corresponds to a light doping configuration, which tends to minimize recombination but also tends to form a poor ohmic metal contact.

Substrate subset 212a had average fluid region sheet resistance of about 276.9 ohm/sq and an average exposed region sheet resistance of about 227.7 ohm/sq. Substrate subset 212b had average fluid region sheet resistance was about 233.2 ohm/sq and an average exposed region sheet resistance of about 127.5 ohm/sq. Substrate subset 212c had average fluid region sheet resistance was about 147.7 ohm/sq and an average exposed region sheet resistance of about 153.8 ohm/sq. Substrate subset 218b had average fluid region sheet resistance was about 179.1 ohm/sq and an average exposed region sheet resistance of about 58.2 ohm/sq. All had a drive-in temperature of about 850° C. or less, which is generally insufficient to create an optimal selective emitter dopant diffusion profile.

In contrast, substrate subsets 218a, 218c, had average exposed region sheet resistances that were too low for optimal selective emitter configuration.

As previously described, a low sheet resistance generally corresponds to a heavy doping configuration, which tends to form a good ohmic metal contact, but also tends to be detrimental to carrier collection due to increased recombination.

Substrate subset 218a had average fluid region sheet resistance was about 35.6 ohm/sq and an average exposed region sheet resistance of 34.1 ohm/sq. Substrate subset 218c had average fluid region sheet resistance was about 48.7 ohm/sq and an average exposed region sheet resistance of about 31.9 ohm/sq. All had a deposition temperature of about 850° C. or less and a drive-in temperature of about 925° C. or less, which is also insufficient to create an optimal selective emitter dopant diffusion profile.

Figure 3A:
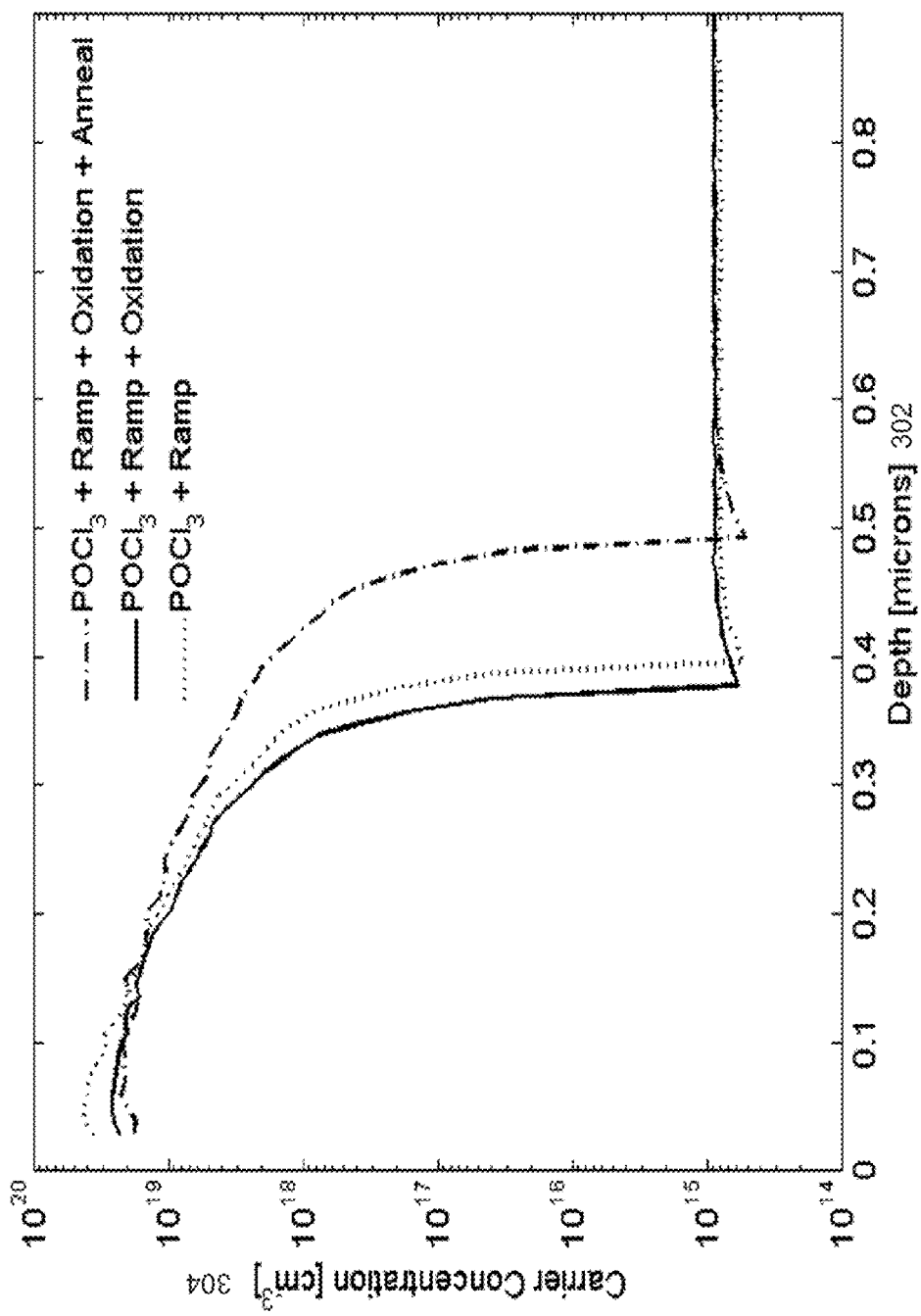
FIGS. 3A-C shows a set of simplified diagrams of phosphorous diffusion profiles for silicon substrates of Experiment 1, in accordance with the invention.
Figure 3B:
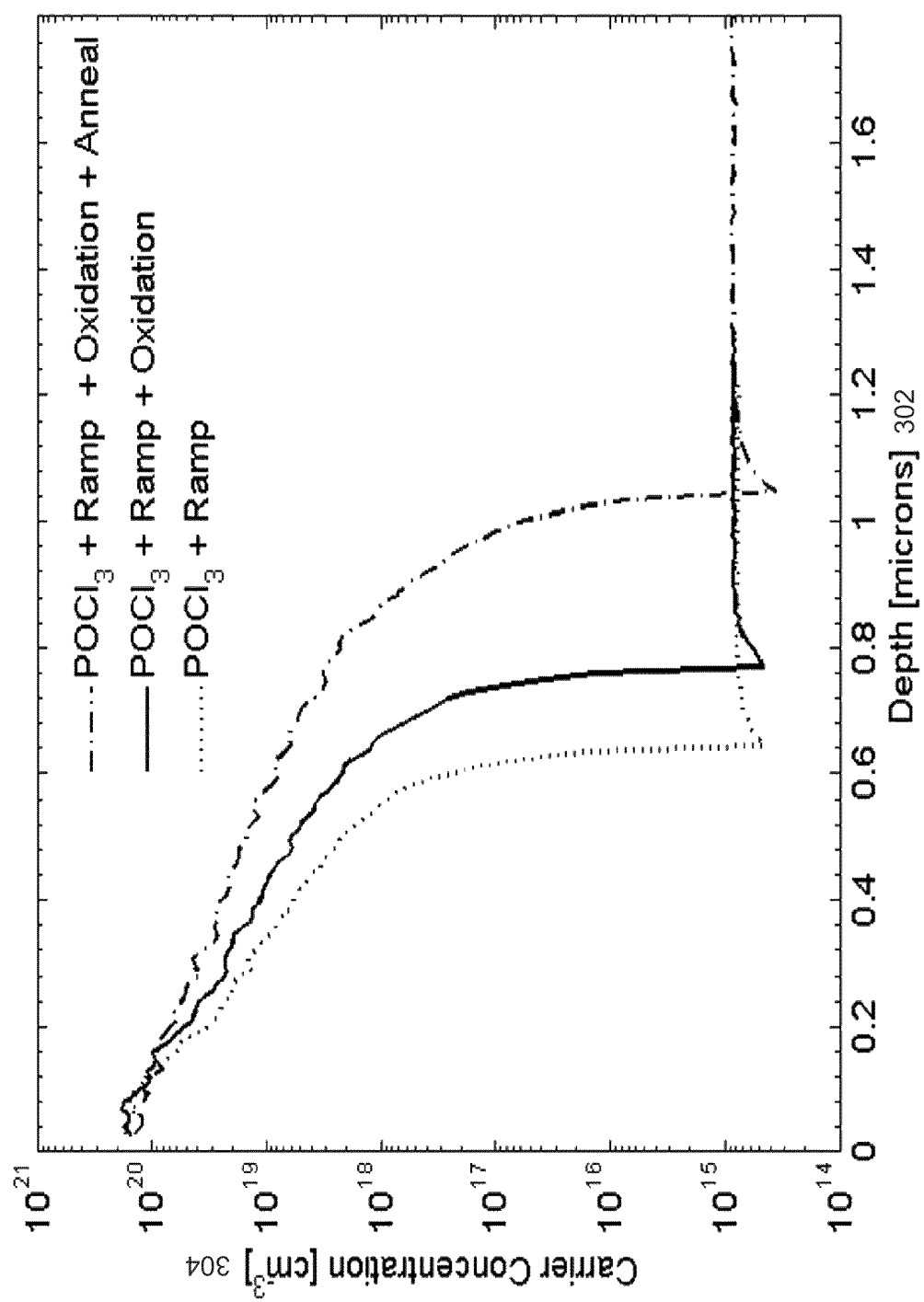
Figure 3C:
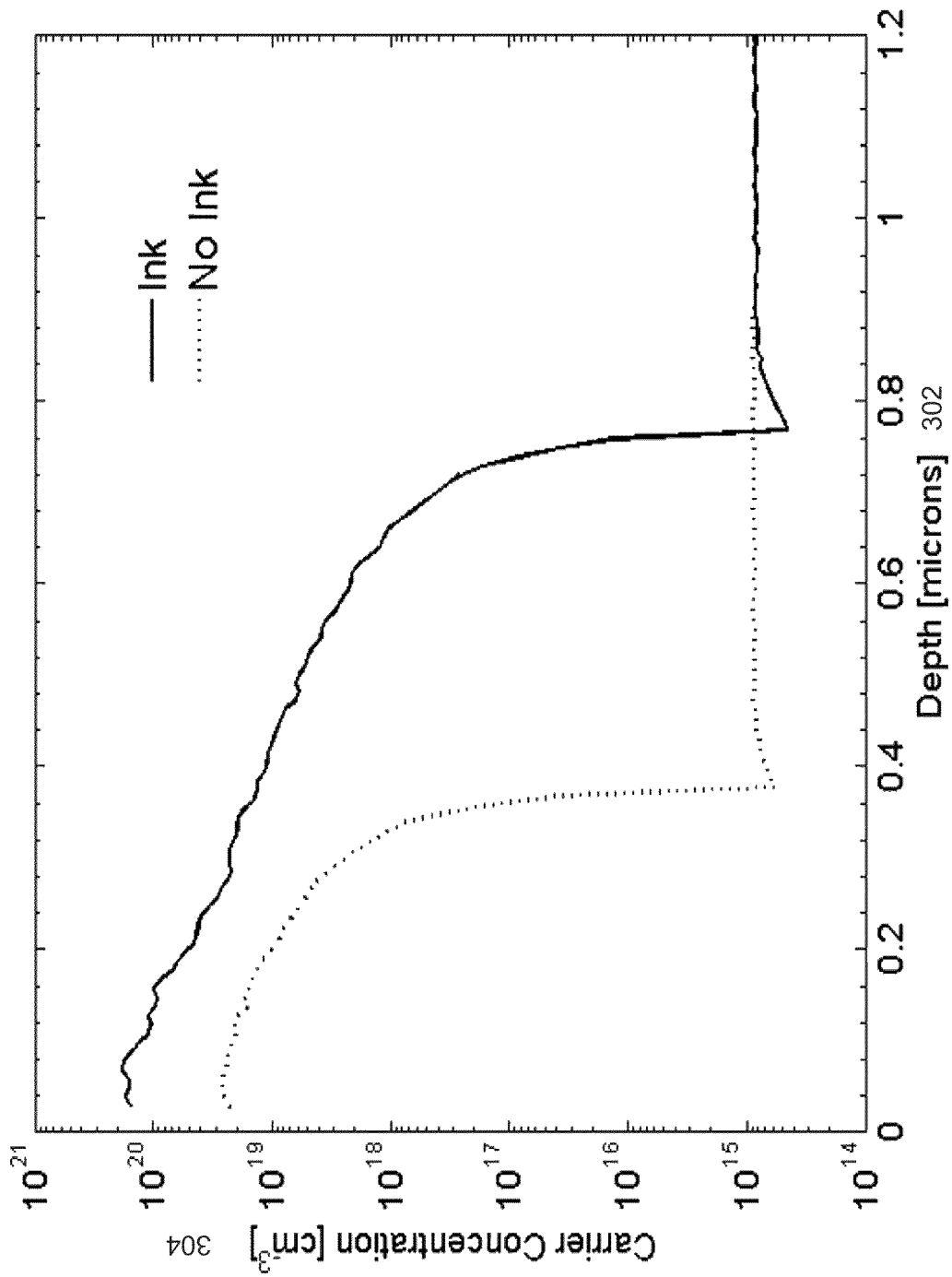

Referring to FIGS. 3A-C, a set of simplified diagrams of phosphorous diffusion profiles, as measured by SRP (Spreading Resistance Probe) for polished silicon substrates which received the same printing and thermal treatments as in Experiment 1, in accordance with the invention. FIG. 3A shows a set of phosphorus profiles under exposed regions after a $POCl_3$ diffusion with various subsequent thermal steps as described above. Depth in microns 302 is shown along the horizontal axis, while carrier concentration in $cm^{-3}$ 304 is show along the vertical axis. As can be seen, surface dopant concentration drops with increasing thermal budget, corresponding to the depletion of the phosphorus content of the PSG in exposed regions as the temperature and duration of drive-in is increased.

FIG. 3B shows a set of phosphorus profiles under fluid regions after a $POCl_3$ diffusion with various subsequent thermal steps as described above. Depth in microns 302 is shown along the horizontal axis, while carrier concentration in $cm^{-3}$ 304 is shown along the vertical axis. As can be seen, the surface concentration remains substantially unchanged while the diffusion profile continues to get deeper into the substrate as temperature and duration of drive-in is increased. These results indicate that, under these processing conditions, the phosphorus content of the PSG in the silicon fluid covered areas is not easily depleted with increasing thermal budget and thus tends to acts as a quasi-inifinite phosphorus source.

FIG. 3C shows a set of phosphorus profiles under both exposed regions and fluid regions after a $POCl_3$ diffusion at about 725° C. for about 35 minutes, followed by a ramp to about 975° C. in main $N_2$, and drive-in for about 15 minutes in main $N_2$ and main $O_2$. Depth in microns 302 is shown along the horizontal axis, while carrier concentration in $cm^3$ 304 is show along the vertical axis. Consequently, the resulting surface concentrations in the fluid regions is about $1.5\times10^{20}$ $cm^{-3}$ while exposed regions is about $2.25\times10^{19}$ $cm^{-3}$.

Experiment 2

Figure 4:
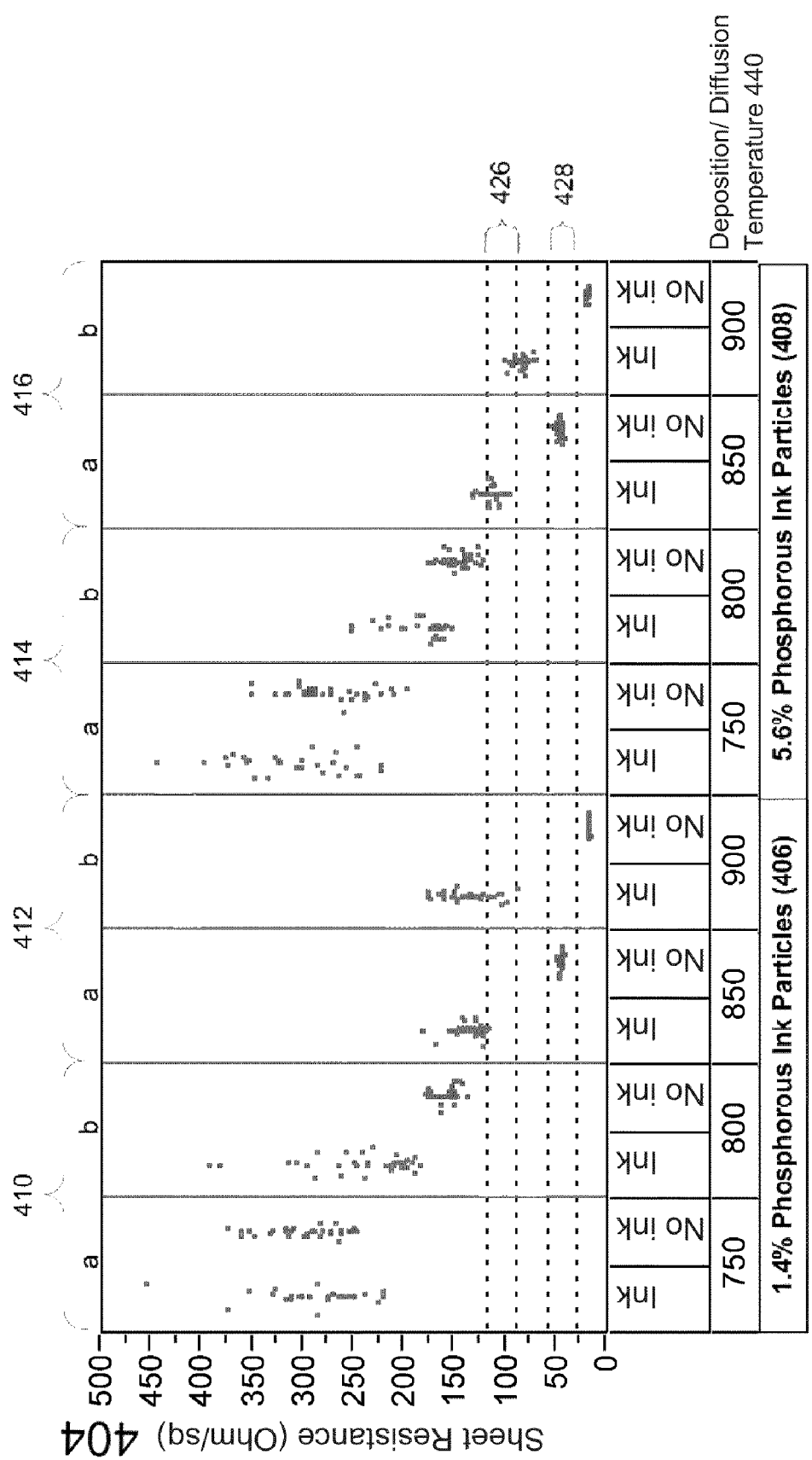
FIG. 4 shows a simplified diagram of eight sets of crystalline silicon substrates in a second experiment configured with various ink configurations, in accordance with the invention.

Referring now to FIG. 4 a simplified diagram is shown of eight sets of crystalline silicon substrates configured with various silicon nanoparticle fluid configurations, in accordance with the invention. All substrate sets comprised of saw-damage etched p-type silicon substrates, each with a thickness of about 180 um and a resistivity of about 2 Ohm-cm. All substrates were first cleaned with piranha (a mixture of sulfuric acid ($H_7SO_4$) and hydrogen peroxide ($H_2O_2$)). This cleaning was followed by a DI water rinsing step and then a subsequent BOE dip followed by a final DI water rinse. The substrates were dried using $N_2$ prior to a silicon nanoparticle fluid comprising about 4 wt % silicon nanoparticle in a set of organic solvents, being deposited on one side of the substrates.

After baking at a temperature of about 600° C. in a baking ambient in a rapid thermal processing (RTP) tool for a time period of about 3 minutes in order to densify the film and evaporate solvent molecules in order to form a densified film. Although the baking ambient was inert in this experiment, an oxidizing ambient may also be used.

The substrates were then exposed to a dopant source in a diffusion furnace in a deposition/drive-in ambient of $POCl_3$, $N_2$, and $O_2$, at a temperatures ranging from about 750° C. to about 900° C. and for a time period of about 35 minutes. The residual PSG layers on the substrate surface and the densified film surface were subsequently removed by a BOE (buffered oxide etch) cleaning step for about 5 minutes.

On one side of the set of substrates 410-412, an ink containing silicon nanoparticles with about 1.4 wt % phosphorous was deposited, whereas on one side of the set of substrates 414-416, an ink containing silicon nanoparticles with about 5.6 wt % phosphorous was deposited. The resultant sheet resistance values for areas with and without ink depositions were then respectively measured.

As previously described, a selective emitter uses a first lightly doped region optimized for low recombination, and a second heavily doped region (of the same dopant type) optimized for low resistance ohmic metal contact.

Consequently, a sheet resistance of between about 90 Ohm/sq to about 120 Ohm/sq, as shown in range 426, is preferred for the lightly doped region, while a sheet resistance of between about 30 Ohm/sq to about 60 Ohm/sq, as shown in range 428, is preferred for the heavily doped region. Substrate sets 412 and 416 all resulted in sheet resistances suitable for selective emitter formation, whereas substrate sets 410 and 414 did not. The configuration of substrate subset 412 and 416 may be used to form a selective emitter, although with an inverse profile. That is, the fluid regions are lightly doped and the exposed regions are heavily doped.

All the substrates in set 412 had a combined deposition/drive-in temperature of about 850° C. or greater for about 35 minutes, a nitrogen (carrier $N_2$) to oxygen (reactive $O_2$) ratio during deposition of 1:1, and a fluid containing silicon nanoparticles with a phosphorous dopant percentage of about 1.4% wt. Substrate subset 412a resulted in an average fluid region sheet resistance of 135.9 ohm/sq and average exposed region sheet resistance of 46.1 ohm/sq, whereas substrate subset 412b resulted in an average fluid region sheet resistance of 135.9 ohm/sq and average exposed region sheet resistance of 17.8 ohm/sq.

Likewise, the substrates in set 416 had a combined deposition/drive-in temperature of about 850° C. or greater for 35 minutes, a nitrogen (carrier $N_2$) to oxygen (reactive $O_2$) ratio during deposition of 1:1, and a fluid containing silicon nanoparticles with a phosphorous dopant percentage of about 5.6% wt. Substrate subset 416a resulted in an average fluid region sheet resistance of 114.5 ohm/sq and average exposed region sheet resistance of 46.7 ohm/sq, whereas substrate subset 416b resulted in an average fluid region sheet resistance of 86.0 ohm/sq and average exposed region sheet resistance of 19.1 ohm/sq.

In contrast, all the substrates in set 410 had a combined deposition/drive-in temperature about 800° C. or less for 35 minutes, a carrier $N_2$ to reactive $O_2$ ratio during deposition of about 1:1, and a fluid containing silicon nanoparticles with a phosphorous dopant percentage of about 1.4% wt. Substrate subset 310a resulted in an average fluid region sheet resistance of about 297.5 ohm/sq and average exposed region sheet resistance of about 304.9 ohm/sq, whereas substrate subset 410b resulted in an average fluid region sheet resistance of about 243.5 ohm/sq and average exposed region sheet resistance of about 157.0 ohm/sq, which is insufficient to create an optimal selective emitter dopant diffusion profile.

In contrast, all the substrates in set 414 had a combined deposition/drive-in temperature about 800° C. or less for 35 minutes, a carrier $N_2$ to reactive $O_2$ ratio during deposition of 1:1, and a fluid containing silicon nanoparticles with a phosphorous dopant percentage of about 5.6% wt. Substrate subset 414a resulted in an average fluid region sheet resistance of about 317.0 ohm/sq and average exposed region sheet resistance of about 275.2 ohm/sq, whereas substrate subset 414b resulted in an average fluid region sheet resistance of 182.6 ohm/sq and average exposed region sheet resistance of about 147.8 ohm/sq, which is also insufficient to create an optimal selective emitter dopant diffusion profile.

Experiment 3

Figure 5:
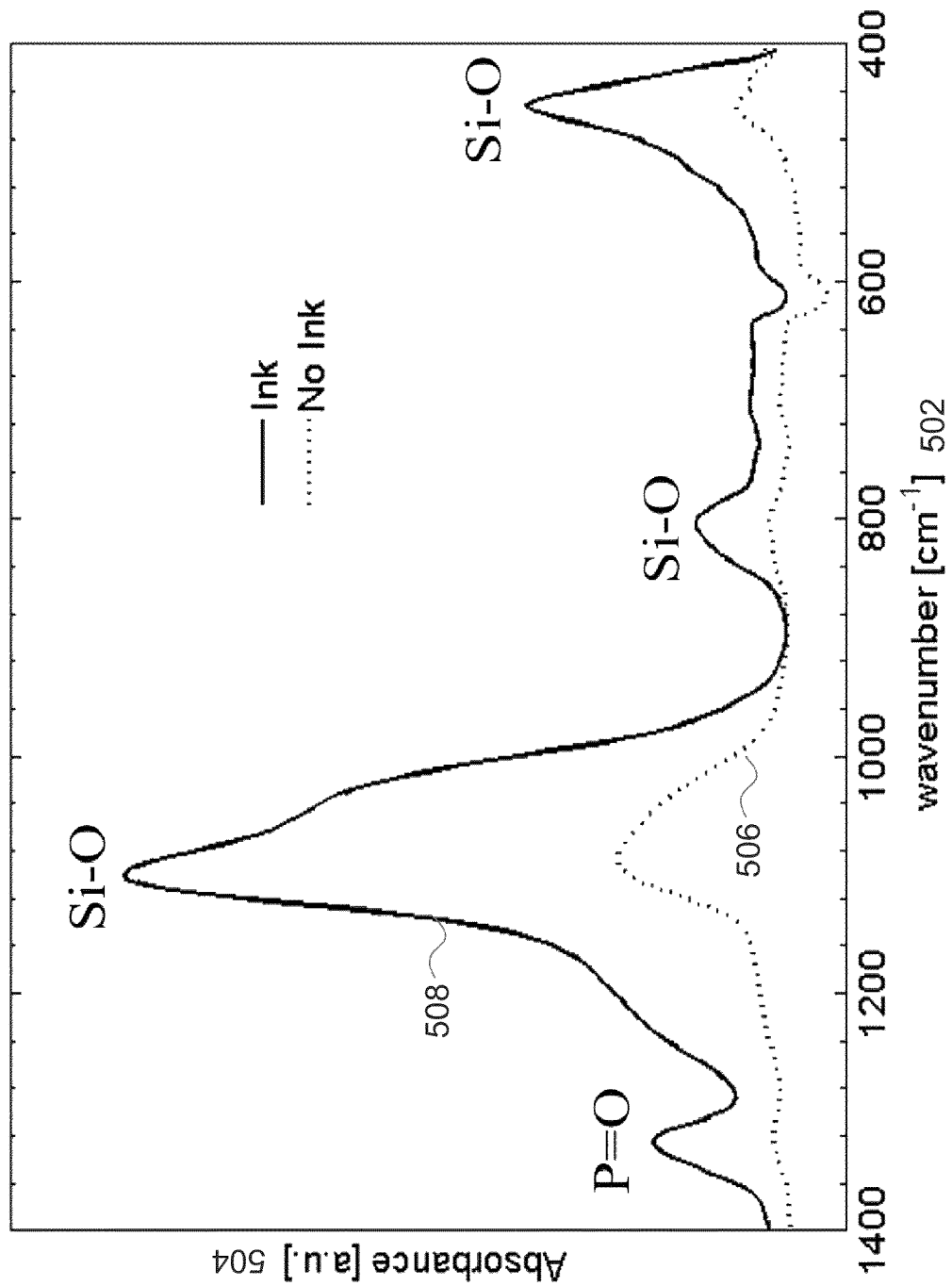
FIG. 5 shows the simplified diagram of a FTIR (Fourier Transform Infra-red) spectra for mono-crystalline silicon substrate in accordance with the invention; and, FIG. 6 shows a simplified diagram of three sets of crystalline silicon substrates configured with various ink configurations, and upon which a phosphorous dopant source was spray-coated, in accordance with the invention.

Referring now to FIG. 5, a simplified diagram of FTIR (Fourier Transform Infra-Red) spectra for a double-sided polished mono-crystalline silicon substrate, with a resistivity of about 10000 Ohm-cm, upon which a fluid containing silicon nanoparticles with about 1.4 wt % phosphorous was deposited, in accordance with the invention. A first spectrum 506 shows the absorbance of substrate areas without deposited ink, while a second spectrum 508 shows the absorbance of substrate areas with deposited ink.

In general, Fourier transform spectroscopy is a measurement technique whereby spectra are collected based on measurements of the temporal coherence of a radiative source, using time-domain measurements of the electromagnetic radiation or other type of radiation 502 (shown as wave number on the horizontal axis). At certain resonant frequencies characteristic of the chemical bonding within a specific sample, the radiation 504 will be absorbed (shown as absorbance A.U. on the vertical axis) resulting in a series of peaks in the spectrum, which can then be used to identify the chemical bonding within samples. The radiation absorption is proportional the number of bonds absorbing at a given frequency.

Here, patterned patches of silicon fluid were deposited onto a polished mono-crystalline silicon substrate such that only portions of the surface are covered. The substrate was heated to about 600° C. for about 3 minutes in an inert ambient in a rapid thermal processing (RTP) tool in order to bake off solvents in the fluid and to further densify the film in order to form a densified film. The substrate was loaded into a standard tube furnace and subjected to a $POCl_3$ deposition step at about 800° C. for about 20 minutes, using a carrier $N_2$ to reactive $O_2$ gas ratio of about 1:1 during deposition. No subsequent drive-in step was performed. The process was thus terminated after PSG deposition onto both the crystalline silicon substrate and the deposited silicon fluid areas.

First spectrum 506 and second spectrum 508 show peaks in the range of 1350 $cm^{-1}$ that is characteristic of P=O (phosphorous oxygen double bonding) and around 450 $cm^{-1}$, 800 $cm^{-1}$, and 1100 $cm^{-1}$ that are characteristic of Si—O(silicon oxygen single bonding), all typical of deposited PSG films. The absorbance of the second (ink) spectrum 508 is substantially greater than the absorbance of the first (non-ink) spectrum 506, indicating that there is significantly more PSG embedded in the ink areas than on the non-ink areas. The evidence of significantly more PSG embedded in the ink areas as compared to the non ink areas is consistent with the larger silicon surface area provided by the ink layer for PSG deposition compared with the silicon substrate surface.

Experiment 4

Figure 6:
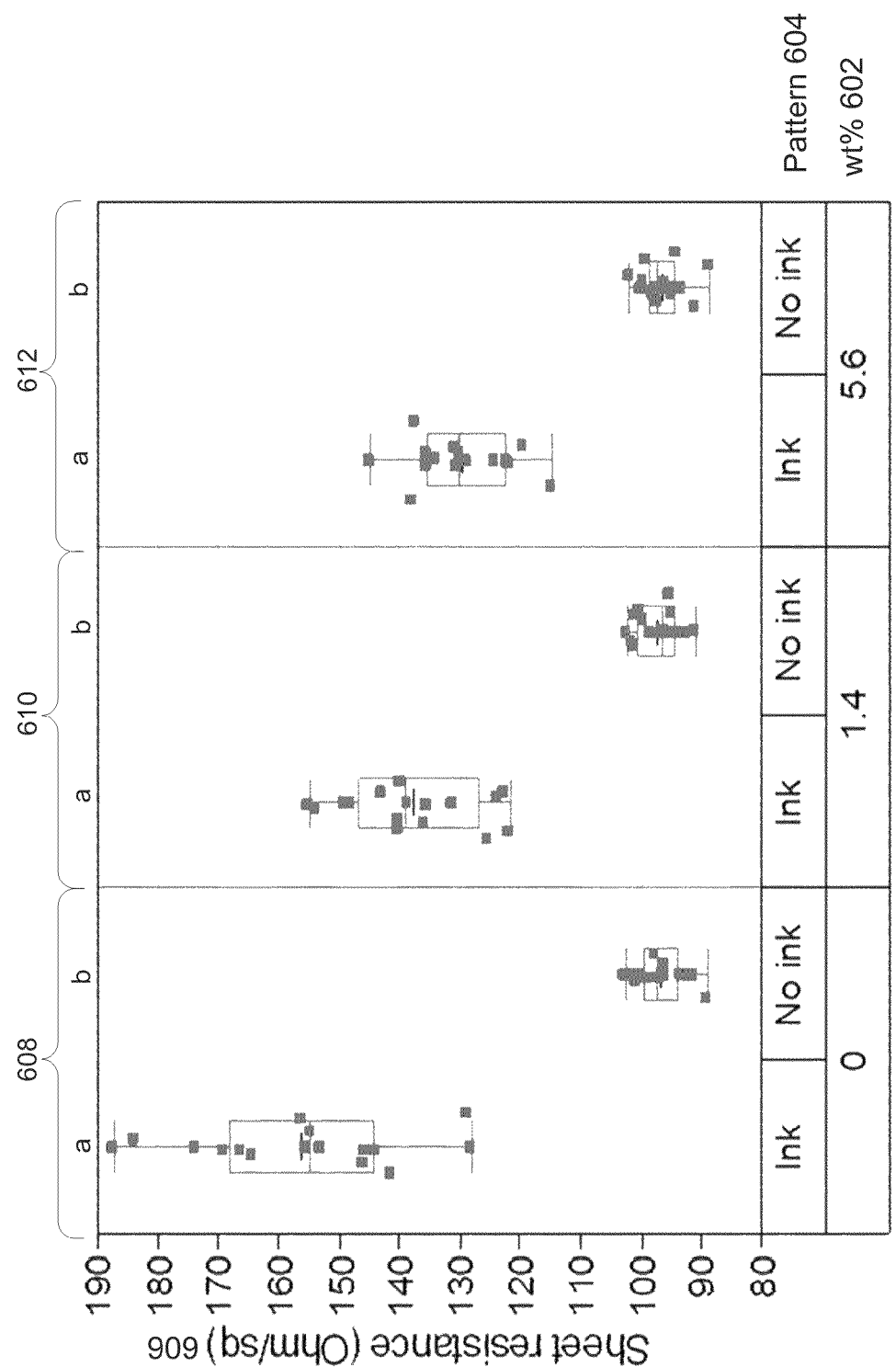

Referring to FIG. 6, a simplified diagram is shown of three sets of crystalline silicon substrates configured with various ink configurations, and upon which a phosphorous dopant source was spray-coated, in accordance with the invention.

All substrate sets comprised of saw-damage etched p-type silicon substrates, each with a thickness of about 180 um and a resistivity of about 2 Ohm-cm. The substrate sets were first cleaned with piranha (a mixture of sulfuric acid ($H_2SO_4$) and hydrogen peroxide ($H_2O_2$)). This cleaning was followed by a DI water rinsing step and then a subsequent buffered oxide etch (BOE) dip followed by a final DI water rinse. Substrates were then dried using $N_2$ prior to a silicon nanoparticle fluid deposited with an ink-jet in a pattern on a front side of the substrates, with substrate set 608 containing silicon nanoparticles with about 0.0 wt % (undoped) phosphorus, substrate set 610 containing silicon nanoparticles with about 1.4 wt % phosphorus, and substrate set 612 containing silicon nanoparticles with about 5.6 wt % phosphorus, all in a set of organic solvents.

The resulting silicon nanoparticle films were then baked at about 600° C. for about 3 min in a rapid thermal processing (RTP) tool, after which they were loaded into an inline doping furnace. A phosphorous dopant source was then spray-coated onto the front side of the substrates, which were subsequently processed at about 800° C. for about 20 min in the conveyor belt furnace. For each set, sheet resistance was then measured in surface areas both with a deposited silicon nanoparticle fluid (ink) and without (exposed). As can be seen in sets 608, 610, and 612, presence of the deposited silicon nanoparticle fluid (608a, 610a, and 612a) on the silicon substrates results in an increased sheet resistance when compared to corresponding exposed areas (608b, 610b, and 612b), implying reduced doping in the areas containing nanoparticle layers. These results indicate that the silicon nanoparticle fluid may be tuned into a suitable range for the lightly doped area of a selective emitter. As can also be seen in sets 608, 610, and 612, increasing doping concentration in the silicon nanoparticles generally results in decreasing sheet resistance under ink areas, demonstrating an enhancement in diffusion of dopant atoms into the substrate.

Experiment 5

Figure 7:
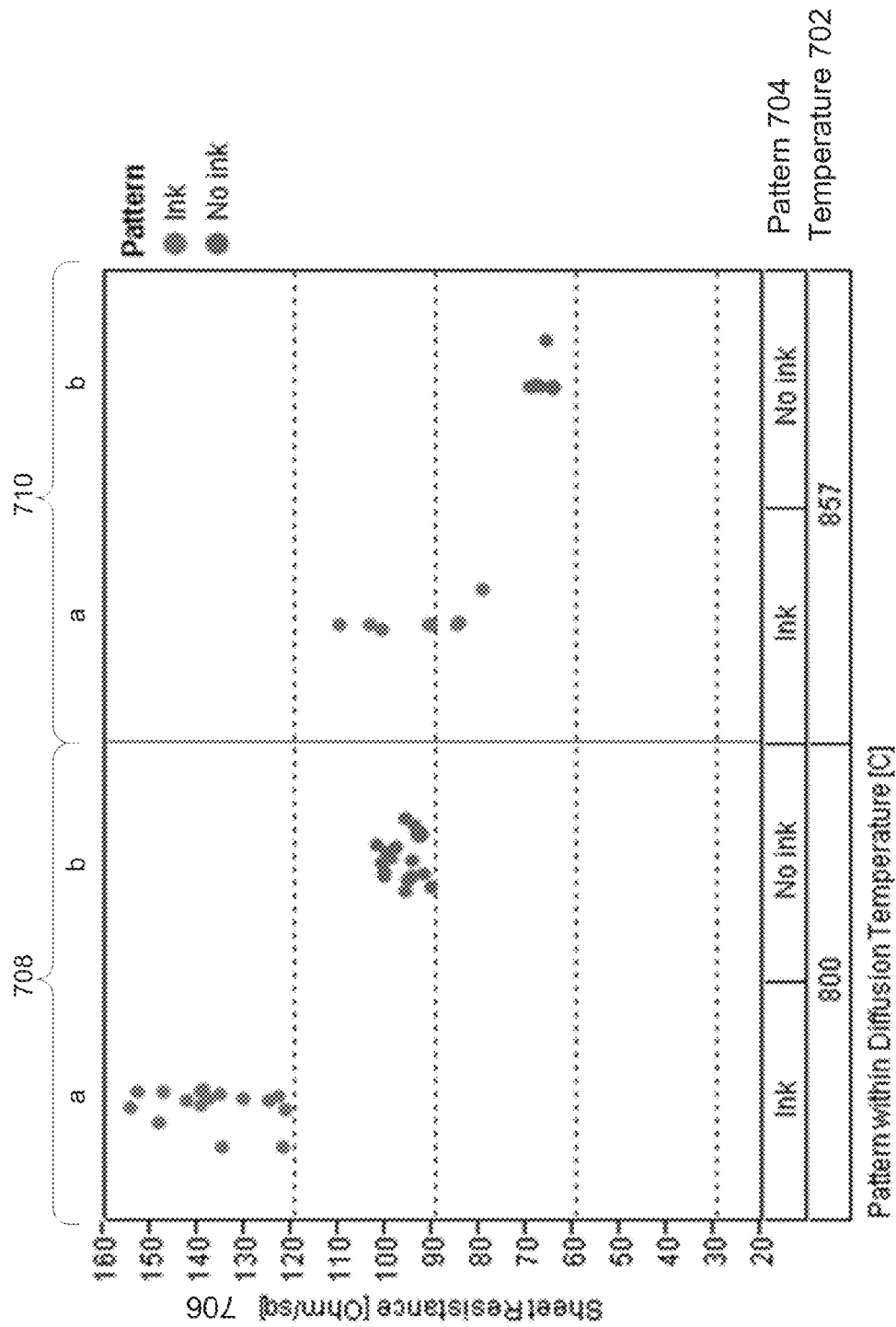
FIG. 7 shows a simplified diagram of two sets of crystalline silicon substrates configured with various ink configurations, and upon which a phosphorous dopant source was spray-coated, in accordance with the invention.

Referring to FIG. 7, a simplified diagram is shown of two sets of crystalline silicon substrates configured with various ink configurations, and upon which a phosphorous dopant source was spray-coated, in accordance with the invention.

All substrate sets comprised of saw-damage etched p-type silicon substrates, each with a thickness of about 180 um and a resistivity of about 2 Ohm-cm. The substrate sets were first cleaned with piranha (a mixture of sulfuric acid ($H_2SO_4$) and hydrogen peroxide ($H_2O_2$)). This cleaning was followed by a DI water rinsing step and then a subsequent buffered oxide etch (BOE) dip followed by a final DI water rinse. Substrates were then dried using $N_2$ prior to a silicon nanoparticle fluid deposited with an ink-jet in a pattern on a front side of the substrates, with substrate sets 708 and 710 containing silicon nanoparticles with about 1.4 wt % phosphorus in a set of organic solvents.

The resulting silicon nanoparticle films were then baked at about 400° C. for about 3 min in an inert ambient in order to densify the film and evaporate solvent molecules in order to form a densified film, after which the substrates were loaded into an inline doping furnace in which phosphorous dopant source was spray-coated onto the front surface of the substrates. Substrate set 708 was subsequently processed at about 800° C. for about 20 min, while substrate set 710 was processed at about 857° C. for about 20 minutes in the conveyor belt furnace. For each set, sheet resistance was then measured in surface areas both with a deposited silicon nanoparticle fluid (ink) and without (exposed).

Consequently, for substrate set 708, the sheet resistances were generally too high for both nanoparticle fluid deposited areas 708a and corresponding exposed areas 708b. However, for substrate set 710, processed at a higher temperature, the sheet resistances for both areas 710a and 710b were substantially lower, with the sheet resistance for nanoparticle fluid deposited areas 710a falling into a suitable range for the lightly doped region of a selective emitter. And although the sheet resistance of the exposed areas 710b falls just outside of the suitable range for the heavily doped region of a selective emitter, the inventors believe that the doping profiles may be tuned via the thermal treatment.

For the purposes of this disclosure and unless otherwise specified, "a" or "an" means "one or more." All patents, applications, references and publications cited herein are incorporated by reference in their entirety to the same extent as if they were individually incorporated by reference.

The invention has been described with reference to various specific and illustrative embodiments. However, it should be understood that many variations and modifications may be made while remaining within the spirit and scope of the invention. Advantages of the invention include the production of low cost and efficient junctions for electrical devices, such as solar cells.

Having disclosed exemplary embodiments and the best mode, modifications and variations may be made to the disclosed embodiments while remaining within the subject and spirit of the invention as defined by the following claims.

What is claimed is:

1. A method of forming a multi-doped junction on a substrate, comprising:
    providing the substrate doped with boron atoms, the substrate comprising a front substrate surface;
    depositing an ink on the front substrate surface in a ink pattern, the ink consisting essentially of a set of undoped nanoparticles and a set of solvents;
    heating the substrate in a baking ambient to a first temperature and for a first time period in order to create a densified film ink pattern;
    exposing the substrate to a dopant source in a diffusion furnace with a deposition ambient, the deposition ambient comprising $POCl_3$, a carrier $N_2$ gas, a main $N_2$ gas, and a reactive $O_2$ gas at a second temperature and for a second time period, wherein a first PSG layer with a first phosphorous amount is formed on the front substrate surface and a second PSG layer with a second phosphorous amount is formed on the densified film ink pattern, and wherein the second phosphorous amount is substantially greater than the first phosphorous amount; and
    heating the substrate in a drive-in ambient to a third temperature;
    wherein a first diffused region with a first sheet resistance is formed under the front substrate surface covered by the densified film ink pattern, and a second diffused region with a second sheet resistance is formed under the front substrate surface not covered with the densified film ink pattern, and
    wherein the first sheet resistance is substantially smaller than the second sheet resistance.

2. The method of claim 1, wherein the first temperature is between about 200° C. and about 800° C. and the first time period is between about 3 minutes and about 20.

3. The method of claim 1, wherein a ratio of the carrier $N_2$ gas to the reactive $O_2$ gas is between about 1:1 to about 1.5:1, the second temperature is between about 700° C. and about 1000° C., and the second time period of about 5 minutes and about 35 minutes.

4. The method of claim 1, wherein the third temperature is between about 800° C. and about 1100° C.

5. The method of claim 1, wherein the first temperature is between about 200° C. and about 800° C. and the first time period is between about 3 minutes and about 8 minutes.

6. The method of claim 1, wherein the second temperature is between about 725° C. and about 825° C., and the second time period is between about 10 minutes and about 35 minutes.

7. The method of claim 1, wherein the second temperature is between about 750° C. and about 850° C., and the second time period is between about 10 minutes and about 30 minutes.

8. The method of claim 1, wherein the second temperature is about 800° C. and the second time period is about 20 minutes 9. The method of claim 1, wherein the third temperature is between about 875° C. and about 1000° C.

10. The method of claim 1, wherein the third temperature is between about 850° C. and about 1050° C.

11. The method of claim 1, wherein the third temperature is about 900° C.

12. The method of claim 1, wherein the step of heating the substrate to the third temperature is carried out at a third time period is between about 15 minutes and about 30 minutes.

13. The method of claim 1, wherein the first sheet resistance is between about 20 Ohm/sq and about 70 Ohm/sq and the second sheet resistance is between about 80 Ohm/sq and about 140 Ohm/sq.

14. The method of claim 1, wherein the first sheet resistance is between about 30 Ohm/sq and about 60 Ohm/sq and the second sheet resistance is between about 90 Ohm/sq and about 120 Ohm/sq.

15. The method of claim 1, wherein the first sheet resistance is between about 30 Ohm/sq and about 50 Ohm/sq and the second sheet resistance is between about 100 Ohm/sq and about 110 Ohm/sq.

16. The method of claim 1, wherein the baking ambient is one of an inert ambient and an oxidizing ambient.

17. The method of claim 1, wherein the drive in ambient is one of an inert ambient and an oxidizing ambient 18. A method of forming a multi-doped junction on a substrate, comprising:
    providing the, substrate doped with boron atoms, the substrate comprising a front substrate surface;
    depositing an ink on the front substrate surface in a ink pattern, the ink consisting essentially of comprising a set of undoped nanoparticles and a set of solvents;
    heating the substrate in a baking ambient to a first temperature of between about 200° C. and about 800° C. and for a first time period of between about 3 minutes and about 20 minutes in order to create a densified film ink pattern;
    exposing the substrate to a dopant source in a diffusion furnace with a deposition ambient, the deposition ambient comprising $POCl_3$, a carrier $N_2$ gas, a main $N_2$ gas, and a reactive $O_2$ gas, wherein a ratio of the carrier $N_2$ gas and the reactive $O_2$ gas is between about 1.5:1 to about 2:1, at a second temperature of between about 725° C. and about 825° C. and for a second time period of about 10 minutes to about 25 minutes,
    wherein a first PSG layer with a first phosphorous amount is formed on the front substrate surface and a second PSG layer with a second phosphorous amount is formed on the densified film ink pattern, and wherein the second phosphorous amount is substantially greater than the first phosphorous amount; and
    exposing the substrate in a drive-in ambient to a third temperature of between about 825° C. and about 875° C. for between about 10 minutes to about 20 minutes;
    wherein a first diffused region with a first sheet resistance is, formed under the front substrate surface covered by the ink pattern, and a second diffused region with a second sheet resistance is formed under the front substrate surface not covered with the ink pattern, and wherein the first sheet resistance is substantially greater than the second sheet resistance.

19. The method of claim 18, wherein the baking ambient is one of an inert ambient and an oxidizing ambient.

20. The method of claim 18, wherein the drive-in ambient is one of an inert ambient and an oxidizing ambient.

21. The method of claim 18, wherein the first sheet resistance is between about 80 Ohm/sq and about 140 Ohm/sq and the second sheet resistance is between about 20 Ohm/sq and about 70 Ohm/sq.

22. The method of claim 18, wherein the first sheet resistance is between about 90 Ohm/sq and about 120 Ohm/sq and the second sheet resistance is between about 30 Ohm/sq and 60 Ohm/sq.

23. The method of claim 18, wherein the first sheet resistance is between about 100 Ohm/sq and about 110 Ohm/sq and the second sheet resistance is between about 30 Ohm/sq and 50 Ohm/sq.

24. A method of forming a multi-doped junction on a substrate, comprising:
providing the substrate doped with boron, the substrate comprising a front substrate surface;
depositing an ink on the front substrate surface in a ink pattern, the ink consisting essentially of a set of undoped nanoparticles and a set of solvents;
heating the substrate in a baking ambient to a first temperature of between about 200° C. and about 800° C. and for a first time period of between about 3 minutes and about 20 minutes in order to create a densified film ink pattern; and
exposing the substrate to a dopant source in a diffusion furnace with a deposition/drive-in ambient of $POCl_3$, a carrier gas, a main $N_2$ gas, and a reactive $O_2$ gas, wherein the carrier $N_2$ gas and the reactive $O_2$ gas have ratio of about 1:1 to about 1.5:1, at a second temperature of between about 850° C. and about 900° C., and for a second time period of about 20 minutes and about 35 minutes, wherein a first PSG layer with a first phosphorous amount is formed on the front substrate surface and a second PSG layer with a second phosphorous amount is formed on the densified film ink pattern and wherein the second phosphorous amount is substantially greater than the first phosphorous amount;
wherein a first diffused region with a first sheet resistance is formed under the front substrate surface covered by the ink pattern, and a second diffused region with a second sheet resistance is formed under the front substrate surface not covered with the ink pattern, and wherein the first sheet resistance is substantially more than the second sheet resistance.

25. The method of claim 24, wherein the first sheet resistance is between about 80 Ohm/sq and about 140 Ohm/sq and the second sheet resistance is between about 20 Ohm/sq and about 70 Ohm/sq.

26. The method of claim 24, wherein the first sheet resistance is Between about 90 Ohm/sq and about 120 Ohm/sq and the second sheet resistance is between about 30 and 60 Ohm/sq.

27. The method of claim 24, wherein the first sheet resistance is between about 100 Ohm/sq and about 110 Ohm/sq and the second sheet resistance is between about 30 Ohm/sq and 50 Ohm/sq.

* * * * *